United States Patent
Ackerman et al.

(10) Patent No.: US 6,926,928 B2
(45) Date of Patent: Aug. 9, 2005

(54) PROTECTION OF A GAS TURBINE COMPONENT BY A VAPOR-DEPOSITED OXIDE COATING

(75) Inventors: John Frederick Ackerman, Laramie, WY (US); Joseph Aloysius Heaney, Middletown, OH (US); Bangalore Aswatha Nagaraj, West Chester, OH (US); James Andrew Hahn, Maineville, OH (US); Michael James Weimer, Loveland, OH (US); Jon Conrad Schaeffer, Simpsonville, SC (US); William Scott Walston, Mason, OH (US)

(73) Assignee: General Electric Company, Schenectady, NY (US)

( * ) Notice: Subject to any disclaimer, the term of this patent is extended or adjusted under 35 U.S.C. 154(b) by 102 days.

(21) Appl. No.: 10/199,185

(22) Filed: Jul. 19, 2002

(65) Prior Publication Data

US 2004/0013802 A1 Jan. 22, 2004

(51) Int. Cl.$^7$ .............................................. C23C 16/18
(52) U.S. Cl. .............................. 427/255.18; 427/255.19
(58) Field of Search ..................... 427/255.18, 255.19

(56) References Cited

U.S. PATENT DOCUMENTS

| 4,332,618 | A | * | 6/1982 | Ballard ........................ 106/605 |
| 5,073,433 | A | * | 12/1991 | Taylor .......................... 428/134 |
| 5,660,885 | A | | 8/1997 | Hasz et al. |
| 5,780,110 | A | | 7/1998 | Schaeffer et al. |
| 5,900,283 | A | | 5/1999 | Vakil et al. |
| 6,532,657 | B1 | * | 3/2003 | Weimer et al. ............ 29/889.2 |
| 6,663,919 | B2 | * | 12/2003 | Farmer et al. .............. 427/453 |

FOREIGN PATENT DOCUMENTS

WO        WO 96/31293 A1 * 10/1996

* cited by examiner

*Primary Examiner*—Timothy Meeks
(74) *Attorney, Agent, or Firm*—McNees Wallace & Nurick LLC

(57) ABSTRACT

A gas turbine component, such as a turbine disk or a turbine seal element, is protected by depositing an oxide coating on the gas turbine component. The deposition is performed by a vapor deposition process such as metal-organic chemical vapor deposition (MOCVD) to a coating thickness of from about 0.2 to about 50 micrometers, preferably from about 0.5 to about 3 micrometers. The deposited oxide may be an oxide of aluminum, silicon, tantalum, titanium, and chromium.

20 Claims, 3 Drawing Sheets

PROTECTION OF A GAS TURBINE COMPONENT BY A VAPOR-DEPOSITED OXIDE COATING

This invention relates to a gas turbine component and, more particularly, to the protection of the gas turbine component against environmental attack during service, using an oxide coating.

BACKGROUND OF THE INVENTION

In an aircraft gas turbine (jet) engine, air is drawn into the front of the engine, compressed by a shaft-mounted compressor, and mixed with fuel. The mixture is burned, and the hot combustion gases are passed through a turbine mounted on the same shaft. The flow of combustion gas turns the turbine, which turns the shaft and provides power to the compressor and to the fan. In a more complex version of the gas-turbine engine, the compressor and a high-pressure turbine are mounted on one shaft having a first set of turbines, and the fan and a low-pressure turbine are mounted on a separate shaft having a second set of turbines. The hot exhaust gases and the air propelled by the fan flow from the back of the engine, driving it and the aircraft forward. The hotter the combustion and exhaust gases, the more efficient is the operation of the jet engine. There is thus an incentive to raise the combustion-gas temperature.

The turbine includes one or more turbine disks (sometimes termed "turbine rotors"), a number of turbine blades mounted to the turbine disks and extending radially outwardly therefrom into the combustion-gas flow path, and rotating turbine seal elements that prevent the hot combustion gases from contacting the turbine shaft and related components. The maximum operating temperature of the combustion gas is limited by the materials used in the turbine. Great efforts have been made to increase the temperature capabilities of the turbine blades, resulting in increasing combustion gas operating temperatures and increased engine efficiency.

As the maximum operating temperature of the combustion gas increases, the turbine disks and turbine seal elements are subjected to higher temperatures in the combustion-gas environment. As a result, oxidation and corrosion of the turbine disks and turbine seal elements have become of greater concern. Alkaline sulfate deposits resulting from the ingested dirt and the sulfur in the combustion gas are a major source of the corrosion, but other elements in the aggressive combustion-and bleed gas environment may also accelerate the corrosion. The oxidation and corrosion damage may lead to premature removal and replacement of the turbine disks and turbine seal elements unless the damage is reduced or repaired.

The turbine disks and turbine seal elements for use at the highest operating temperatures are made of nickel-base superalloys selected for good toughness and fatigue resistance. These superalloys are selected for their mechanical properties. They have some resistance to oxidation and corrosion damage, but that resistance is not sufficient to protect them at the operating temperatures that are now being reached.

The current state of the art is to operate the turbine disks and turbine seal elements without any coatings to protect them against oxidation and corrosion. At the same time, a number of oxidation-resistant and corrosion-resistant coatings have been considered for use on the turbine blades. These available turbine-blade coatings are generally too thick and heavy for use on the turbine disks and turbine seal elements and also may adversely affect the fatigue life of the turbine disks and turbine seal elements. There remains a need for an approach for protecting turbine disks and turbine seal elements against oxidation and corrosion as the operating-temperature requirements of the turbine disks and turbine seal elements increase. This need extends to other components of the gas turbine engine that operate in similar temperature ranges, as well. The present invention fulfills this need, and further provides related advantages.

BRIEF SUMMARY OF THE INVENTION

The present invention provides a method for protecting a gas turbine component used at a moderately elevated service operating temperature. The approach allows the mechanical performance of the gas turbine component to be optimized using the best available alloy. The selected alloy is protected against environmental damage using a protective coating that is applied at a relatively low temperature. The protective coating is highly adherent, does not adversely affect the properties of the underlying base metal, and is so thin that it does not significantly alter the dimensions of the article to which it is applied. The protective coating is also readily reconditioned and repaired if necessary.

A method for protecting a gas turbine component comprises the steps of providing the gas turbine component, and depositing an oxide coating on the gas turbine component by vapor deposition.

The gas turbine component may be of any type, but the present approach is particularly advantageous when used to protect gas turbine components or portions thereof that experience a service operating temperature of from about 1000° F. to about 1400° F. Examples of particular interest include all or part of a turbine disk or a turbine seal element. The entire gas turbine component need not be protected in many cases. For example, the mid-to-outer portion of the hub of the turbine disk may be coated, while the bore region, inner portion of the hub, and blade slots may or may not be coated.

The oxide coating is preferably deposited by metal organic chemical vapor deposition (MOCVD). The MOCVD process is a non-line-of-sight process, in which the deposited oxide is deposited upon portions of the substrate that are not visible from an external source, ensuring complete coverage and protection. The MOCVD process operates for many deposited oxides at relatively low substrate temperatures in the range of about 750–950° F. Achieving acceptable deposition at the low deposition temperature is desirable, because the substantially higher temperatures required for many other coating-formation processes would adversely affect the structure of the substrate gas turbine component. At higher coating temperatures, there is the potential for undesirable reductions in shot peening effects and also part distortions due to residual stresses. The service temperatures of turbine disk alloys are typically from about 1100° F. to about 1400° F., and it is therefore desirable to perform any coating at temperatures below this range. Examples of oxides that are readily and desirably deposited by MOCVD include the oxide of a material selected from the group consisting of aluminum, silicon, tantalum, titanium, and chromium. All of these oxides may be deposited by MOCVD at temperatures below these ranges, except for silica. MOCVD deposition of silica is performed at temperatures within this range, and care is taken to keep the deposition time as short as possible. MOCVD may be used to deposit the oxide coating in a thickness of from about 0.2 to about 50 micrometers, although it is preferred that the oxide coating have a thickness of from about 0.5 to about 3 micrometers.

The present approach "deposits" the coating as an oxide, rather than "grows" the coating, a key advantage. Oxide coatings may be grown on a substrate simply by exposing the substrate to an oxidizing environment, either as part of the manufacturing operation or in service. The oxide coatings that are grown by exposure are of an undefined chemical and physical character, and typically include a mixture of oxides determined by the nature of the substrate material. The thickness of the oxide coating is difficult to control with precision.

In the present approach, on the other hand, the oxide coating is deposited in its final form, rather than being dependent upon processing and/or service exposure. The oxide coating is of a well-defined composition based upon the selection of the source reactants, and the composition is largely independent of the underlying composition of the substrate component upon which it is deposited. The oxide coating is of a well-defined type due to the source reactants and the deposition conditions. The oxide coating is deposited to a well-defined thickness and is substantially uniform (or controllably nonuniform) throughout the thickness. The oxide coating is stable at the service temperatures reached by the articles such as gas turbine disks. The protective coating may be readily redeposited or repaired in reconditioning operations.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

DETAILED DESCRIPTION OF THE INVENTION

Figure 1:
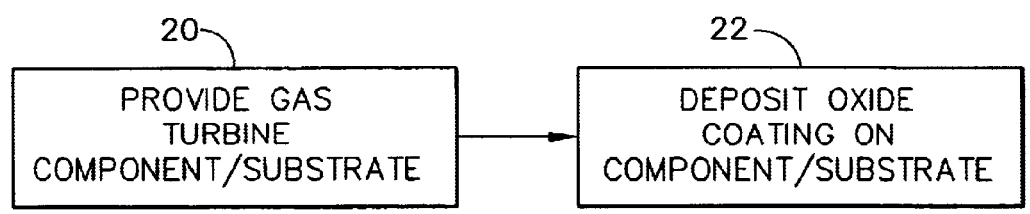
FIG. 1 is a block flow diagram of an approach for practicing the invention.
Figure 2:
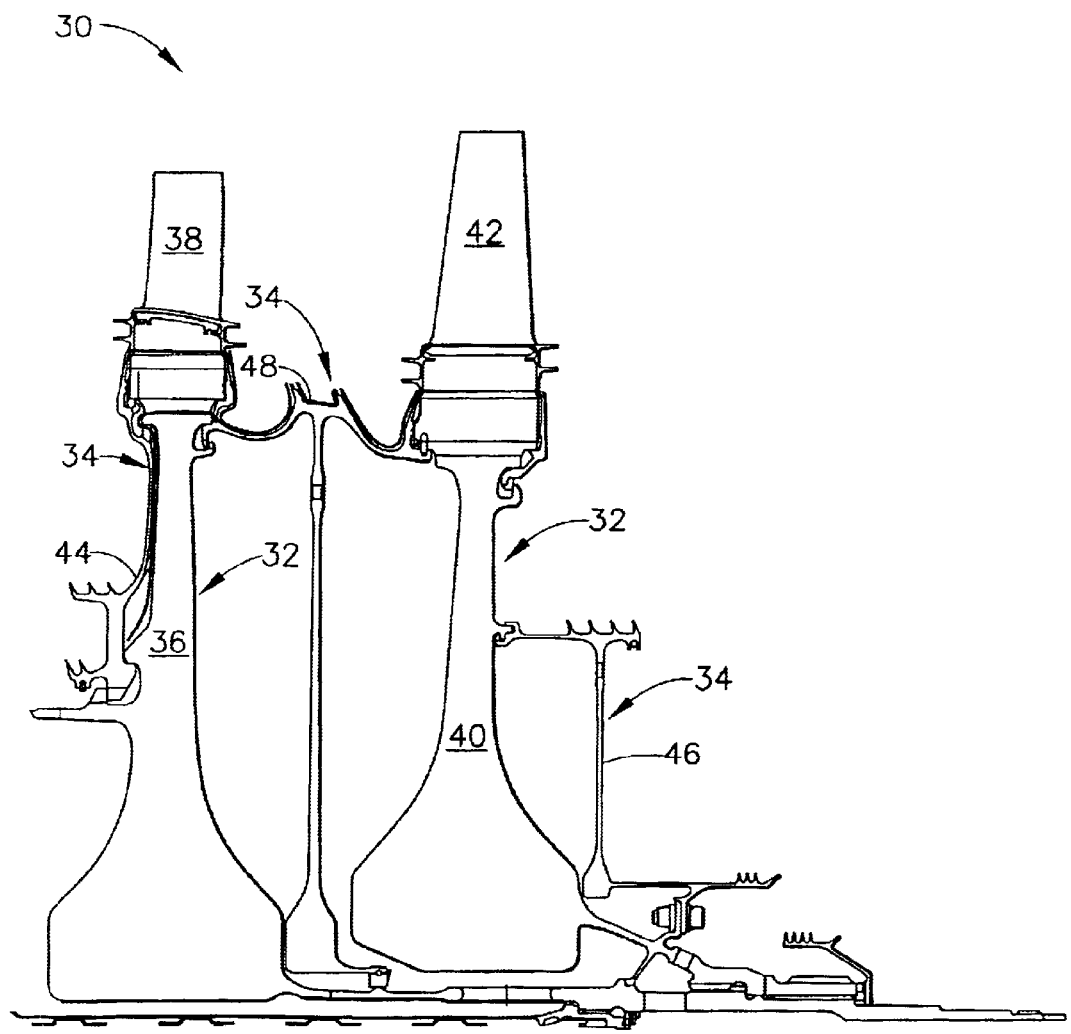
FIG. 2 is a schematic view of a portion of the turbine section of a gas turbine engine.

FIG. 1 depicts a preferred approach for practicing the invention. A gas turbine component 30, an example of which is illustrated in FIG. 2, is provided, step 20. The gas turbine component 30 may be of any operable type. The gas turbine component 30 may be, for example, a turbine disk 32 or a turbine seal element 34. FIG. 2 schematically illustrates a stage 1 turbine disk 36, a stage 1 turbine blade 38 mounted to the stage 1 turbine disk 36, a stage 2 turbine disk 40, a stage 2 turbine blade 42 mounted to the stage 2 turbine disk 40, a forward seal 44, an aft seal 46, and an interstage seal 48. Any or all of these turbine disks 32 and/or turbine seal elements 34 may be provided for coating by the present approach, depending upon whether corrosion by the hot combustion gases is expected or observed. In a typical case, only a portion of the selected turbine component 30 is coated. The turbine blades 38 and 42 are not coated by the present approach.

The turbine component is preferably made of a nickel-base alloy, most preferably a nickel-base superalloy. A nickel-base alloy has more nickel than any other element. A nickel-base superalloy is strengthened by the precipitation of gamma prime or a related phase. A nickel-base superalloy of interest is Rene 88, a known alloy having a nominal composition, in weight percent, of 13 percent cobalt, 16 percent chromium, 4 percent molybdenum, 3.7 percent titanium, 2.1 percent aluminum, 4 percent tungsten, 0.70 percent niobium, 0.015 percent boron, 0.03 percent zirconium, 0.03 percent carbon, balance nickel and minor impurities.

Figure 3:
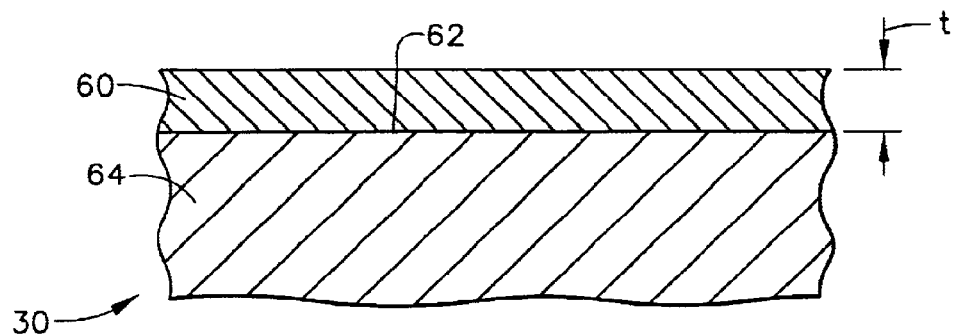
FIG. 3 is a schematic view of an oxide protective coating deposited upon a component substrate.

An oxide coating is deposited upon the gas turbine component 30 by vapor deposition, step 22 of FIG. 1. FIG. 3 illustrates the oxide coating 60 deposited upon a surface 62 of the gas turbine component 30, which thereby serves as a substrate 64 for the oxide coating 60.

The oxide coating 60 is typically deposited upon the surfaces 62 of those portions of the gas turbine component 60 that experience a service operating temperature of from about 1000° F. to about 1400° F. The oxide coating 60 is preferably not needed on those portions, such as the portions of the turbine disk 32 near the center bore, whose service operating temperature is less than about 1000° F., because the natural oxidation and corrosion resistance of the materials of construction provide sufficient resistance. In that case, the oxide coating 60 is an unnecessary weight and expense. The oxide coating 60 is typically not used on those portions whose service operating temperature is greater than about 1400° F., because the oxide coating has a tendency to spall and fail at these higher temperatures. More complex protective coatings, such as aluminide diffusion or overlay coatings, and optionally thermal barrier coatings, are required at such higher temperatures. The present thin oxide coatings are designed to provide oxidation and corrosion protection in the indicated intermediate-temperature range.

Figure 4:
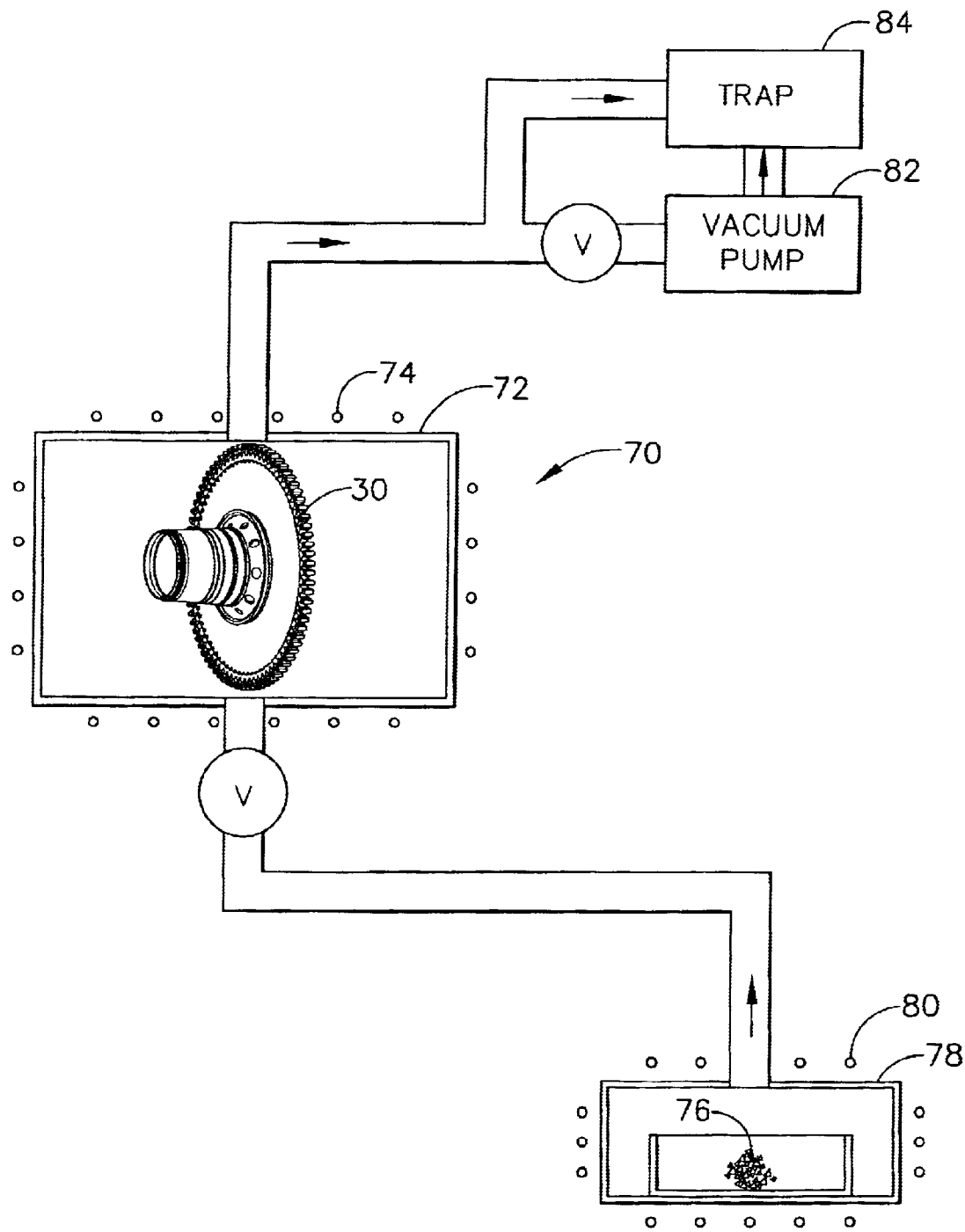
FIG. 4 is a schematic view of an MOCVD apparatus.

The oxide coating 60 is deposited by a vapor deposition process, most preferably a metal organic chemical vapor deposition (MOCVD) process. FIG. 4 illustrates an MOCVD apparatus 70 in which such an MOCVD deposition may be performed. MOCVD deposition procedures and deposition apparatus are known for other applications, and the following is a brief description of the essential elements. The MOCVD apparatus 70 includes a deposition chamber 72 in which the gas turbine component 30 to be coated is placed. Those portions of the gas turbine component 30 that are not to be coated are masked prior to placement in the deposition chamber 72. The deposition chamber 72 is heated to the desired deposition temperature by appropriate heaters 74, such as resistance elements.

An important feature of the MOCVD process is that the component 30 upon which the oxide coating 60 is deposited is heated to a relatively low temperature during the deposition process. The gas turbine components 30 are typically forged or otherwise mechanically worked alloys, which are subject to heat treatments, peening, and other processing to attain very specific microstructures and other structures that are beneficial to their subsequent functionality. A high deposition temperature would adversely affect this structure. The deposition temperature to which the gas turbine component 30 must be heated in the deposition chamber 72 depends upon the material being deposited. In many cases, however, that deposition temperature is in the range of about 750–950° F., below the expected service operating temperature of the coated portion of the gas turbine component 30. In some cases of particular oxide coatings 60, the deposition temperatures are necessarily higher, and these higher deposition temperatures are used only with care and consideration to avoid adverse effects on the underlying gas turbine component 30.

The reagents 76 that produce a deposition vapor are placed into a reagent source chamber 78 that is heated by heaters 80. The reagents 76 are organic chemical compounds that contain the elements to be deposited. Some examples of materials that may be carried as organic vapors that also contain oxygen and may deposited by this approach as their oxides include aluminum, silicon, tantalum, titanium, and chromium. Examples of organic chemical compounds that may be used to transport such materials will be discussed subsequently. The reagents 76 produce an organic vapor that contains and transports the metal and all other elements needed to form the oxide coating 60.

The vapor produced from the reagent source chamber 78 flows to the deposition chamber 72 and thence around the gas turbine component 30 to deposit upon its surface 62. Another important feature of the MOCVD process is that it is a non-line-of-sight process. The metal-bearing vapors flow around the article being coated, reaching regions that are not readily accessible by line-of-sight deposition processes.

The deposition 22 is normally conducted in a reduced-pressure environment, so that the deposition chamber 72 is provided as a vacuum chamber. A vacuum pump 82 is provided to evacuate the deposition chamber 72 as needed. A trap 84 traps, filters, and condenses the released organic vapors that are removed from the deposition chamber 72 either directly or by the vacuum pump 82.

A thickness t of the oxide coating 60 (FIG. 3) is determined in part by the nature of the metal organic vapor, the temperature of deposition, and the time of exposure of the gas turbine component 30 to the metal organic vapor. The thickness t of the oxide coating 60 is typically from about 0.2 to about 50 micrometers. More preferably, the thickness t of the oxide coating 60 is from about 0.5 to about 3 micrometers. It is preferred that the oxide coating 60 be relatively thin, as thicker oxide coatings 60 tend to debond from the surface 62 and spall away during repeated thermal cycles between room temperature and the service operating temperature. If the oxide coating 60 is too thin, such as less than about 0.2 micrometers, there may be incomplete coverage of the surface 62 (i.e., bare spots) and insufficient thickness to resist oxidation and corrosion of the protected substrate 64. If the oxide coating 60 is too thick, there is a tendency for it to debond and spall away from the surface. Studies have determined that the thickness of the oxide coating in the range of about 0.5–3 micrometers, most preferably about 1–2 micrometers, is preferred, providing a balance of good adhesion of the oxide coating 60 to the surface 62 and good protection of the substrate 64.

The present approach has been practiced using simulated turbine component hardware, following the procedure of FIG. 1 and using the apparatus of FIG. 4, to produce coated articles as in FIG. 3. The deposited oxides, their source reagents, their deposition temperatures, and their deposition pressures for these depositions are as follows: (1) aluminum oxide, deposited from aluminum tri-isopropoxide, also known as $Al(OPr)_3$, metal organic vapor at 790° F. and 100 mtorr partial pressure plus 1 torr nitrogen partial pressure; (2) titanium oxide, deposited from titanium tetra-ethoxide, also known as $Ti(OEt)_4$, metal organic vapor at 800° F. and 150 mtorr partial pressure; (3) tantalum oxide, deposited from tantalum penta-ethoxide, also known as $Ta(OEt)_5$, metal organic vapor at 800° F. and 120 mtorr partial pressure; and (4) silica, deposited from silicon tetraethoxide, also known as $Si(OEt)_4$, metal organic vapor at 1275° F. and 500 mtorr vapor. Silicon and other elements which are not strictly metals are included in the group of elements that may be deposited by MOCVD, and are included as "metals" herein. One of the features of MOCVD is that different ones of the reagents may be simultaneously provided in one or more reagent source chambers 78, vaporized, and co-deposited to form oxide coatings 60 of a complex oxide composition.

The invention has been reduced to practice and demonstrated to yield results superior to those of uncoated articles.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A method for protecting a gas turbine component, comprising the steps of
   providing the gas turbine component made of a nickel-base alloy and having a surface; and
   depositing an oxide coating directly upon the surface of the nickel-base-alloy gas turbine component by metal-organic chemical vapor deposition.

2. The method of claim 1, wherein the step of providing the gas turbine component includes the step of
   providing a turbine disk.

3. The method of claim 1, wherein the step of providing the gas turbine component includes the step of
   providing a turbine seal element that is a turbine forward seal, a turbine aft seal, or a turbine interstage seal.

4. The method of claim 1, wherein the step of depositing the oxide coating includes the step of
   depositing the oxide coating on a portion of the gas turbine component having a service operating temperature of from about 1000° F. to about 1400° F.

5. The method of claim 1, wherein the step of providing includes the step of
   providing the gas turbine component made of a nickel-base superalloy.

6. The method of claim 1, wherein the step of depositing the oxide coating includes the step of depositing the oxide coating in a thickness of from about 0.2 to about 50 micrometers.

7. The method of claim 1, wherein the step of depositing the oxide coating includes the step of depositing the oxide coating in a thickness of from about 0.5 to about 3 micrometers.

8. The method of claim 1, wherein the step of depositing the oxide coating includes the step of
   depositing the oxide coating of an oxide of a material selected from the group consisting of aluminum, silicon, tantalum, titanium, and chromium.

9. A method for protecting a gas turbine component, comprising the steps of
   providing the gas turbine component made of a nickel-base alloy and having a surface; and
   depositing an oxide coating directly upon the surface of the nickel-base-alloy gas turbine component by vapor deposition, wherein the step of depositing the oxide coating includes the step of depositing the oxide coating of an oxide of a material selected from the group consisting of aluminum, silicon, tantalum, titanium, and chromium.

10. A method for protecting a gas turbine component, comprising the steps of
    providing the gas turbine component made of a nickel-base alloy and having a surface; and
    depositing an oxide coating directly upon the surface of the nickel-base-alloy gas turbine component by vapor deposition, wherein the step of depositing the oxide coating includes the step of depositing the oxide coating in a thickness of from about 0.2 to about 50 micrometers.

11. The method of claim 10, wherein the step of depositing the oxide coating includes the step of depositing the oxide coating in a thickness of from about 0.5 to about 3 micrometers.

12. The method of claim 10, wherein the step of depositing the oxide coating includes the step of depositing the oxide coating of an oxide of a material selected from the group consisting of aluminum, silicon, tantalum, titanium, and chromium.

13. A method for protecting a gas turbine component, comprising the steps of providing the gas turbine component selected from the group consisting of a turbine disk and a turbine seal element that is a turbine forward seal, a turbine aft seal, or a turbine interstage seal; and depositing an oxide coating upon a portion of the gas turbine component by metal-organic chemical vapor deposition, the oxide coating having a thickness of from about 0.2 to about 50 micrometers; and operating the portion of the gas turbine component having the oxide coating thereon at a service operating temperature of from about 1000° F. to about 1400° F.

14. The method of claim 13, wherein the step of depositing the oxide coating includes the step of depositing the oxide coating of an oxide of a material selected from the group consisting of aluminum, silicon, tantalum, titanium, and chromium.

15. The method of claim 13, wherein the step of depositing the oxide coating includes the step of depositing the oxide coating in a thickness of from about 0.5 to about 3 micrometers.

16. The method of claim 9, wherein the step of providing includes the step of providing the gas turbine component made of a nickel-base alloy and having a surface, and wherein the step of depositing includes the step of depositing the oxide coating upon the surface of the nickel-base-alloy gas turbine component by vapor deposition.

17. The method of claim 15, wherein the step of providing includes the step of providing the gas turbine component made of a nickel-base superalloy.

18. A method for protecting a gas turbine component, comprising the steps of providing the gas turbine, component, the gas turbine component being selected from the group consisting of a turbine disk and a turbine seal element that is a turbine forward seal, a turbine aft seal, or a turbine interstage seal; and depositing an oxide coating upon a portion of the gas turbine component having a service operating temperature of from about 1000° F. to about 1400° F., the step of depositing the oxide coating including the step of depositing the oxide coating by metal-organic chemical vapor deposition, the oxide coating having a thickness of from about 0.5 to about 3 micrometers and comprising an oxide of a material selected from the group consisting of aluminum, silicon, tantalum, titanium, and chromium.

19. The method of claim 13, wherein the step of providing includes the step of providing the gas turbine component made of a nickel-base alloy and having a surface, and wherein the step of depositing includes the step of depositing the oxide coating upon the surface of the nickel-base-alloy gas turbine component.

20. The method of claim 17, wherein the step of providing includes the step of providing the gas turbine component made of a nickel-base superalloy.

* * * * *

UNITED STATES PATENT AND TRADEMARK OFFICE
CERTIFICATE OF CORRECTION

PATENT NO. : 6,926,928 B2
DATED : August 9, 2005
INVENTOR(S) : Ackerman et al.

It is certified that error appears in the above-identified patent and that said Letters Patent is hereby corrected as shown below:

Column 8,
Line 11, "turbine, component" should be -- turbine component --.
Line 28, "claim 13" should be -- claim 18 --.
Line 36, "claim 17" should be -- claim 19 --.

Signed and Sealed this

Twenty-first Day of February, 2006

JON W. DUDAS
*Director of the United States Patent and Trademark Office*